(12) United States Patent
Miura et al.

(10) Patent No.: US 7,466,061 B2  
(45) Date of Patent: Dec. 16, 2008

(54) ACOUSTIC BOUNDARY WAVE DEVICE, RESONATOR AND FILTER

(75) Inventors: Michio Miura, Kawasaki (JP); Satoru Matsuda, Kawasaki (JP); Takashi Matsuda, Kawasaki (JP); Masanori Ueda, Kawasaki (JP); Seiichi Mitobe, Yokohama (JP)

(73) Assignees: Fujitsu Limited, Kawasaki (JP); Fujitsu Media Devices Limited, Yokohama (JP)

( * ) Notice: Subject to any disclaimer, the term of this patent is extended or adjusted under 35 U.S.C. 154(b) by 13 days.

(21) Appl. No.: 11/806,988

(22) Filed: Jun. 5, 2007

(65) Prior Publication Data

US 2007/0278898 A1 Dec. 6, 2007

(30) Foreign Application Priority Data

Jun. 6, 2006 (JP) ............... 2006-157568

(51) Int. Cl.  
*H03H 9/25* (2006.01)

(52) U.S. Cl. .............. 310/313 R; 310/340; 310/346; 333/193

(58) Field of Classification Search .......... 310/313 R, 310/340, 341, 346; 333/187, 193  
See application file for complete search history.

(56) References Cited

U.S. PATENT DOCUMENTS

2006/0138902 A1* 6/2006 Kando .................. 310/313 D  
2008/0067896 A1* 3/2008 Inoue et al. ............... 310/335

FOREIGN PATENT DOCUMENTS

JP 2003-209458 7/2003  
WO WO 98/52279 11/1998

OTHER PUBLICATIONS

Yamaguchi, et al.; "Highly Piezoelectric Boundary Waves in Si/SiO$_2$/LiNbO$_3$ Structure"; 1998 IEEE International Frequency Control Symposium, pp. 484-488.

* cited by examiner

*Primary Examiner*—Thomas M Dougherty  
(74) *Attorney, Agent, or Firm*—Arent Fox LLP

(57) ABSTRACT

An acoustic boundary wave device includes a first medium having piezoelectricity, electrodes that are provided on the first medium and excite acoustic waves, a second medium made of a material different from the first medium and provided on the first medium so as to cover the electrodes, and a third medium that has a heat conductivity higher than that of the second medium and is provided so as to contact an upper surface of the second medium and at least a part of side surfaces of the second medium.

12 Claims, 10 Drawing Sheets

ACOUSTIC BOUNDARY WAVE DEVICE, RESONATOR AND FILTER

BACKGROUND OF THE INVENTION

1. Field of the Invention

This invention generally relates to acoustic boundary wave devices, and more particularly, to an acoustic boundary wave device having an electrode provided on a first medium, in which a second medium is provided on the electrode and the first medium, and a third medium is provided on the second medium. Further, the present invention relates to resonators and filters using such an acoustic boundary wave device.

2. Description of the Related Art

Surface acoustic wave (SAW) devices are well known as devices using acoustic waves. The SAW devices are widely used in various circuits that process radio signals in the frequency range of 45 MHz to 2 GHz. Typically, such circuits are provided in cellular phones, and are, for example, transmit/receive filters, receive bandpass filters, local oscillation filters, antenna duplexers, IF filters and FM modulators.

In order to improve the temperature characteristic, Japanese Patent Application Publication No. 2003-209458 (Document 1) discloses a SAW device having a piezoelectric substrate on which a silicon oxide film having the sign of the temperature characteristic different from that of the piezoelectric substrate is grown. Further, the SAW device has the acoustic waves that are mostly propagated through the surface of the piezoelectric substrate. Therefore, a foreign particle on the surface of the piezoelectric substrate may vary or degrade the characteristics. For instance, the frequency may be varied or electrical loss may be increased. Thus, the SAW chip is packaged in a hermetically sealed structure. This makes it difficult to downsize the SAW device and reduce the production cost.

In order to realize improved temperature characteristics, downsizing and cost reduction, an acoustic boundary wave device is proposed in WO 98/52279 (Document 2) or Masatsune Yamaguchi, Takashi Yamashita, Ken-ya Hashimoto, Tatsuya Omori, "Highly Piezoelectric Boundary Waves in $Si/SiO_2/LiNbO_3$ Structure", proceeding of 1998 IEEE International Frequency Control Symposium (the United States), IEEE, 1998, pp. 484-488 (Document 3). The boundary wave is propagated along the boundary between different media. FIG. 1 is a plan view of an acoustic boundary wave device disclosed in Document 2. Broken lines depict electrodes 12 provided below a third medium 16 and a second medium 14. The electrodes 12 are formed on a piezoelectric substrate 10, and the second medium 14 is provided on the electrodes 12. The second medium 14 is formed by a silicon oxide film and the third medium 16 is formed by silicon film. The electrodes 12 include a pair of comb-like electrodes 12 and a pair of reflectors 24. Extraction electrodes 22 are connected to the comb-like electrodes 20, while no extraction electrodes are connected to the reflectors 24. The second medium 14 and the third medium 16 are not formed on the extraction electrodes 22.

The duplexer or filter used close to an antenna circuit of the cellular phone is required to a power durability realizing sufficient resistance to a high input voltage. One of the ways to improve the power durability is to improve heat radiation.

FIG. 2 is a schematic cross-sectional view taken along a line A-A shown in FIG. 1. The electrodes are formed on the substrate 10, and the second medium 14 is provided so as to cover the electrode 12. Further, the third medium 16 is provided on the second medium 14. As indicated by arrows, some heat generated in the electrodes 12 conducts through the substrate 10 and is then radiated. In contrast, heat conducting to the third medium 16 through the second medium 14 is not radiated, and raises the temperature of the electrodes 12. This degrades the power durability.

SUMMARY OF THE INVENTION

The present invention has been made in view of the circumstances and provide an acoustic boundary wave device having improved heat radiation.

Another object of the present invention is to provide a resonator and a filter using such an acoustic boundary wave device.

According to an aspect of the present invention, there is provided an acoustic boundary wave device including: a first medium having piezoelectricity; electrodes that are provided on the first medium and excite acoustic waves; a second medium made of a material different from the first medium and provided on the first medium so as to cover the electrodes; and a third medium that has a heat conductivity higher than that of the second medium and is provided so as to contact an upper surface of the second medium and at least a part of side surfaces of the second medium.

According to another aspect of the present invention, there are provided a resonator and a filter respectively including the above-mentioned acoustic boundary wave device.

BRIEF DESCRIPTION OF THE DRAWINGS

Embodiments of the present invention will be described with reference to the accompanying drawings, in which.

DESCRIPTION OF THE PREFERRED EMBODIMENTS

A description will now be given of embodiments of the present invention with reference to the accompanying drawings.

First Embodiment

A first embodiment of the present invention is an exemplary resonator having a resonance frequency close to 1.9

Figure 3A:
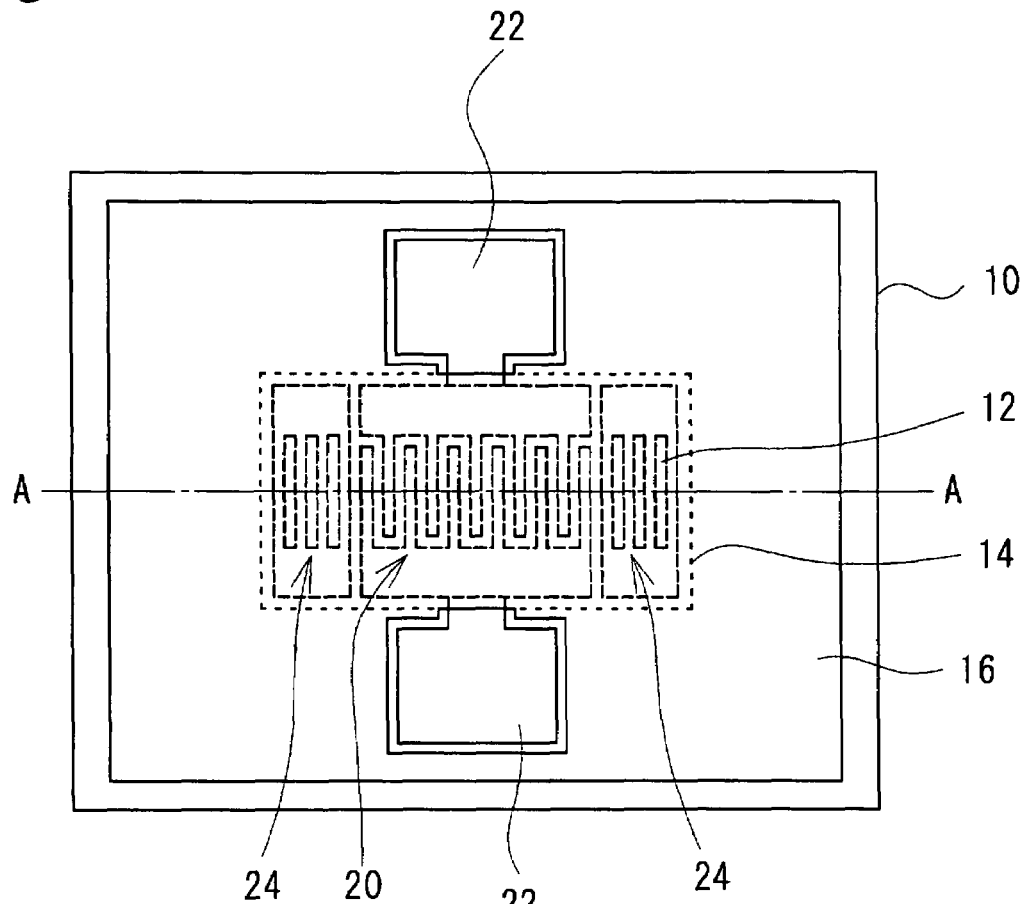
FIG. 3A is a plan view of a resonator in accordance with a first embodiment.
Figure 3B:
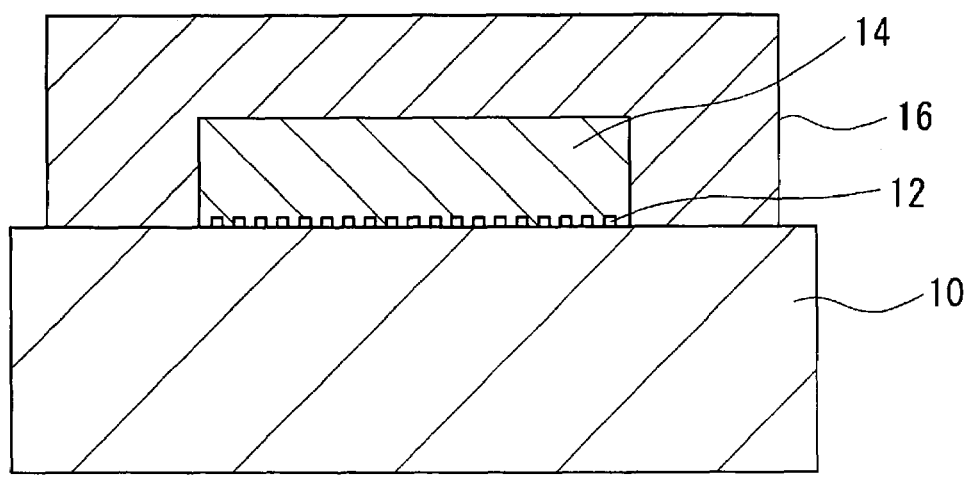
FIG. 3B is a cross-sectional view taken along a line A-A shown in FIG. 3A.

GHz. FIG. 3A is a plan view of a resonator of the first embodiment. The second medium 14 provided below the third medium 16 is depicted by a dotted line, and the electrodes 12 below the second medium are depicted by broken lines. FIG. 3B is a cross-sectional view taken along a line A-A shown in FIG. 3. Referring to FIG. 3A, the piezoelectric substrate 10 may be a 30° rotation Y-cut $LiTaO_3$. The electrodes 12 are made of copper and have a thickness of, for example, 180 nm. The second medium 14 that totally covers the electrodes 12 may be a silicon oxide film and has a thickness of, for example, 1.0 μm. The third medium 16, which may be an aluminum oxide film, has a thickness of, for example, 2.0 μm so as to cover the side and upper surfaces of the second medium 14.

Referring to FIG. 3A, the electrodes 12 excite an acoustic wave and includes the comb-like electrodes 20 and the reflectors 24. The fingers of the electrodes 12 have a pitch of 2 μm and a width of 0.5 μm. The pitch of the electrode fingers, and the thickness of the second medium 14 are designed so as to obtain a desired frequency range. It is to be noted that the third medium 16 is not provided on the extraction electrodes 22 via which electric signals are applied to or drawn from the acoustic boundary wave device. The third medium 16 covers the second medium 14 so as to cover the side surfaces of the second medium 14 and contact the substrate 10.

The $LiTaO_3$ or $LiNbO_3$ substrate, which may be typically used as the piezoelectric substrate 10, has a heat conductivity of approximately 2 W/m·K. Oxide silicon, which may be used as the second medium 14 has a heat conductivity of approximately 1 W/m·K. The second medium 14 functions to delay the acoustic velocity, as compared to the piezoelectric substrate 10 or the third medium 16 and confine the acoustic boundary wave within the second medium 14. The third medium 16 may be made of silicon, silicon nitride, aluminum nitride, or aluminum oxide, which have heat conductivities of about 160, 70, 150, and 35 W/m·K, respectively. That is, the third medium 16 has a higher heat conductivity than the second medium 14.

Figure 4:
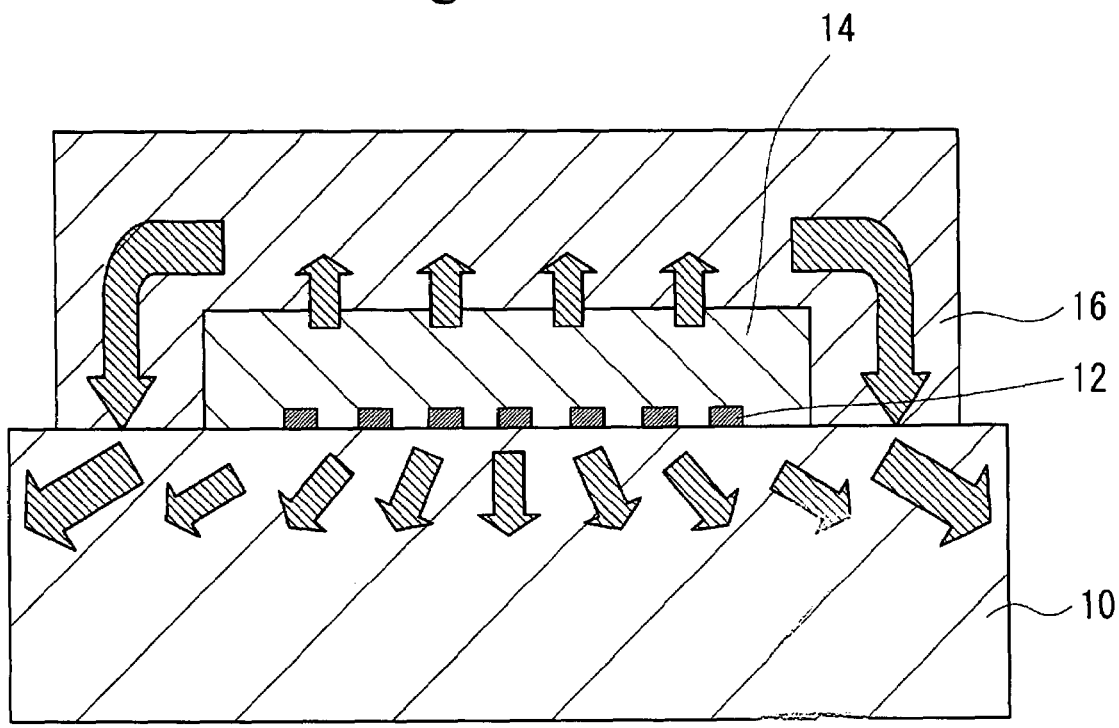
FIG. 4 schematically shows heat conduction in the resonator of the first embodiment.

FIG. 4 is a schematic cross-sectional view of the cross section of the first embodiment. The third medium 16 has a heat conductivity higher than that of the second medium 14. Further, the third medium 16 contacts at least a part of the side surfaces of the second medium 14 and the top thereof. Further, the third medium 16 contacts the piezoelectric substrate 10 (first medium). Heat generated in the electrodes 12 conducts through the piezoelectric substrate 10 and is then radiated. Further, heat conducts through the second medium 14 and reaches the third medium 16. Then, heat conducts through the third medium 16 having a relatively high heat conductivity, and is then radiated through the substrate 10. It is thus possible to effectively radiate heat generated in the electrodes 12.

Second Embodiment

Figure 5A:
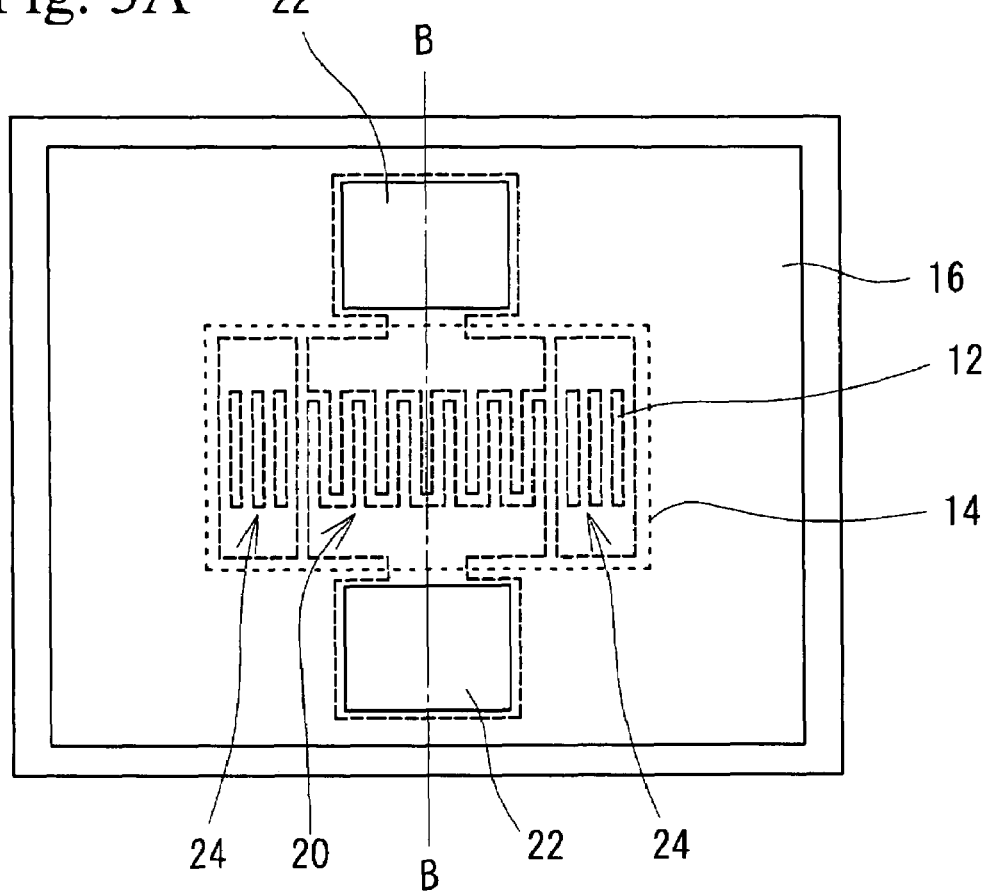
FIG. 5A is a plan view of a resonator in accordance with a second embodiment.
Figure 5B:
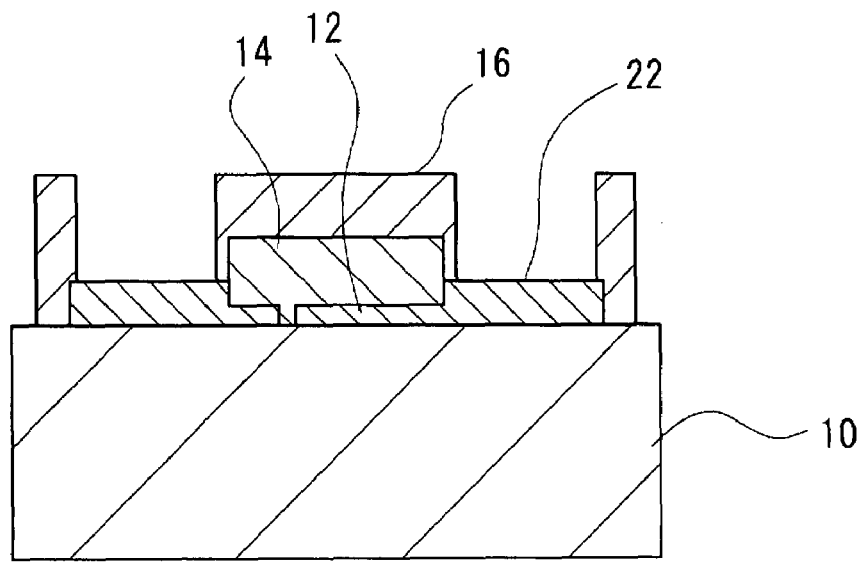
FIG. 5B is a cross-sectional view taken along a line B-B shown in FIG. 5A.

A second embodiment has an exemplary arrangement in which the third medium contacts a radiator. FIG. 5A is a plan view of an acoustic boundary wave device in accordance with the second embodiment, and FIG. 5B is a cross-sectional view taken along a line B-B shown in FIG. 5A. Referring to FIGS. 5A and 5B, the second embodiment differs from the first embodiment in which the third medium 16 is provided around the extraction electrodes 22. The other structures of the second embodiment are the same as those of the first embodiment, and a description thereof will be omitted here.

Figure 6:
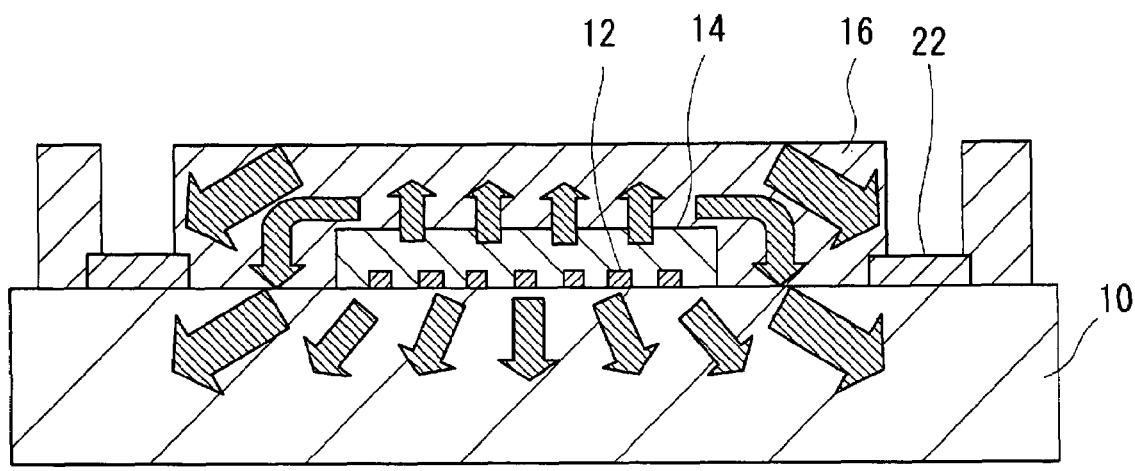
FIG. 6 schematically shows heat conduction in the resonator of the second embodiment.

FIG. 6 schematically shows the cross-section of the second embodiment. The extraction electrodes made of metal provided on the piezoelectric substrate 10 function as a radiator, and at least a part of the third medium 16 contacts the extraction electrodes 22. This structure allows heat to conduct from the third medium 16 to the extraction electrodes 22 and further facilitates radiation of heat. The radiator may be a dummy electrode that is not connected to the electrodes 12. However, it is preferable to use an electrode electrically connected to the electrodes 12, such as the extraction electrodes 22. This is because the use of the existing electrodes does not need an additional radiator. More preferably, the radiator may be an electrode that thermally contacts an outside of the device, because heat of the radiator may be effectively dissipated to the outside. An example of such an electrode may be an electrode for bumps.

Third Embodiment

Figure 7:
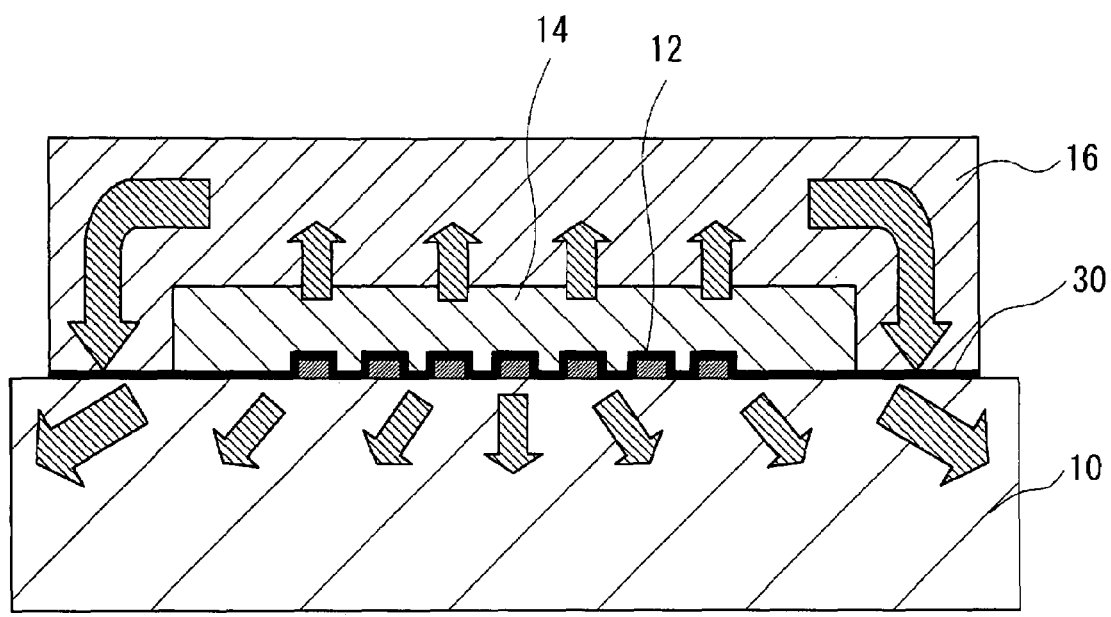
FIG. 7 schematically shows heat conduction in a resonator of a third embodiment.

A third embodiment has an exemplary structure in which a barrier layer is added to the first embodiment. FIG. 7 shows a schematic cross-sectional view of the third embodiment. A barrier layer 30 is provided between the piezoelectric substrate 10 and the third medium 16, between the piezoelectric substrate 10 and the second medium 14, and between the electrodes 12 and the second medium 14. The barrier layer 30 may be a silicon nitride film having a thickness of tens of nm. The other structures of the third embodiment are the same as those of the first embodiment, and a description thereof will be omitted here. When the electrodes 12 are made of copper, the barrier layer 30 prevents copper from diffusing into the silicon oxide film of the second medium 14. At least a part of the third medium 16 thermally contacts the piezoelectric substrate 10 (first medium) via the barrier layer 30. Since the barrier layer 30 is very thin, heat in the third medium 16 can be radiated to the substrate 10, as shown in FIG. 7. Preferably, the heat conductivity of the barrier layer 30 is greater than that of the second medium 14. Preferably, the barrier layer 30 is thinner than the second medium 14.

Fourth Embodiment

Figure 8:
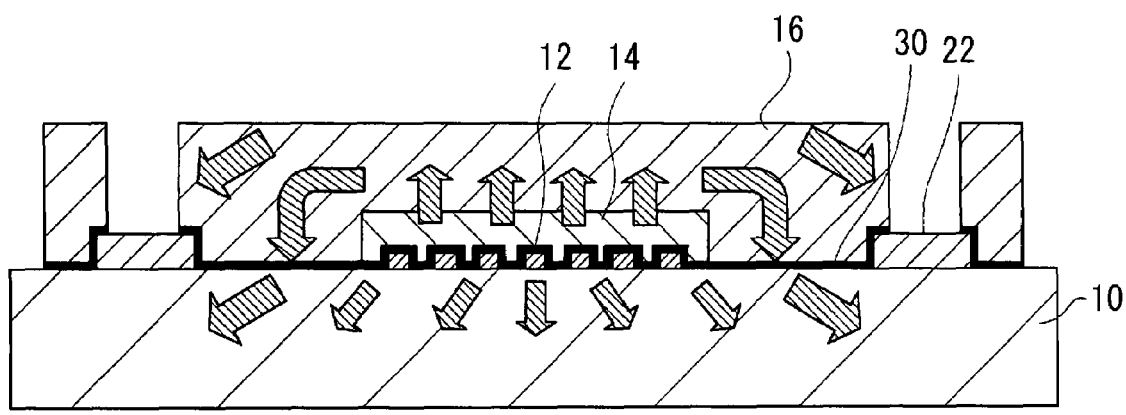
FIG. 8 schematically shows heat conduction in a resonator of a fourth embodiment.

A fourth embodiment has an exemplary arrangement in which the barrier layer is added to the second embodiment. FIG. 8 is a schematic cross-sectional view of a resonator in accordance with the fourth embodiment. In addition to the structure of the third embodiment shown in FIG. 7, at least a part of the third medium 16 thermally contacts the radiator (extraction electrodes 22) via the barrier layer 30. The other structures of the fourth embodiments are the same as those of the third embodiment, and a description thereof will be omitted here. Since the barrier layer 30 is thin, heat in the third medium 16 can be radiated through the radiator.

Fifth Embodiment

Figure 9:
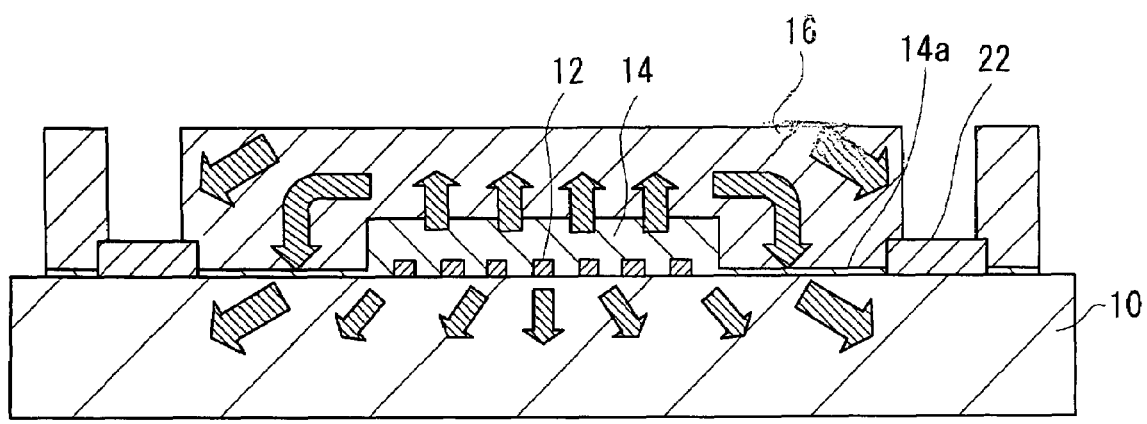
FIG. 9 schematically shows heat conduction in a resonator of a fifth embodiment.

A fifth embodiment has an exemplary arrangement in which the third medium 16 thermally contacts the piezoelectric substrate 10 via a second medium 14a, as shown in FIG. 9, which is a schematic cross-section of a resonator in accordance with the fifth embodiment. As compared to the second embodiment, the second medium 14a, which is relatively thin, is formed around the electrodes 12 including the comb-like electrodes and reflectors and is located outside of the second medium 14. The other structures of the fifth embodiment are the same as those of the second embodiment, and a description thereof will be omitted here. For example, the second medium 14a may be 100 nm thick. Thus, heat in the third medium 16 can easily conduct to the piezoelectric substrate 10 via the thin second medium 14a.

Figure 1:
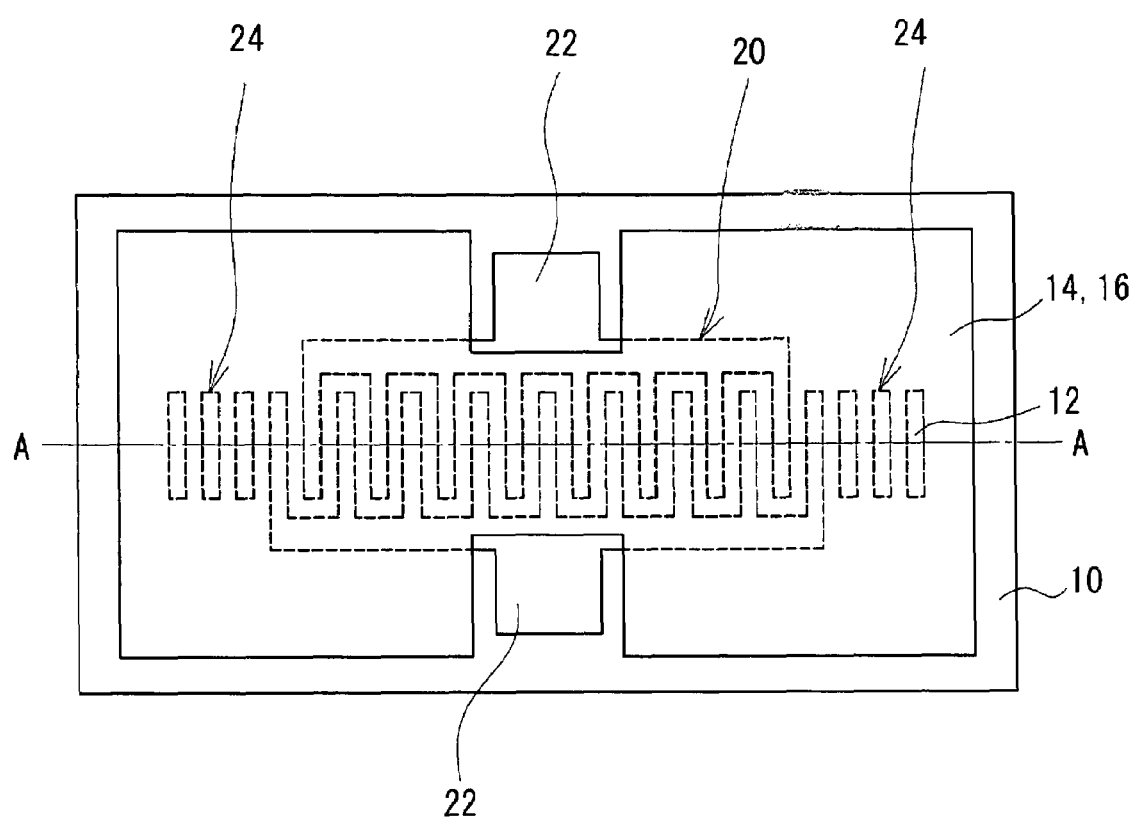
FIG. 1 is a plan view of a conventional acoustic boundary wave device.
Figure 2:
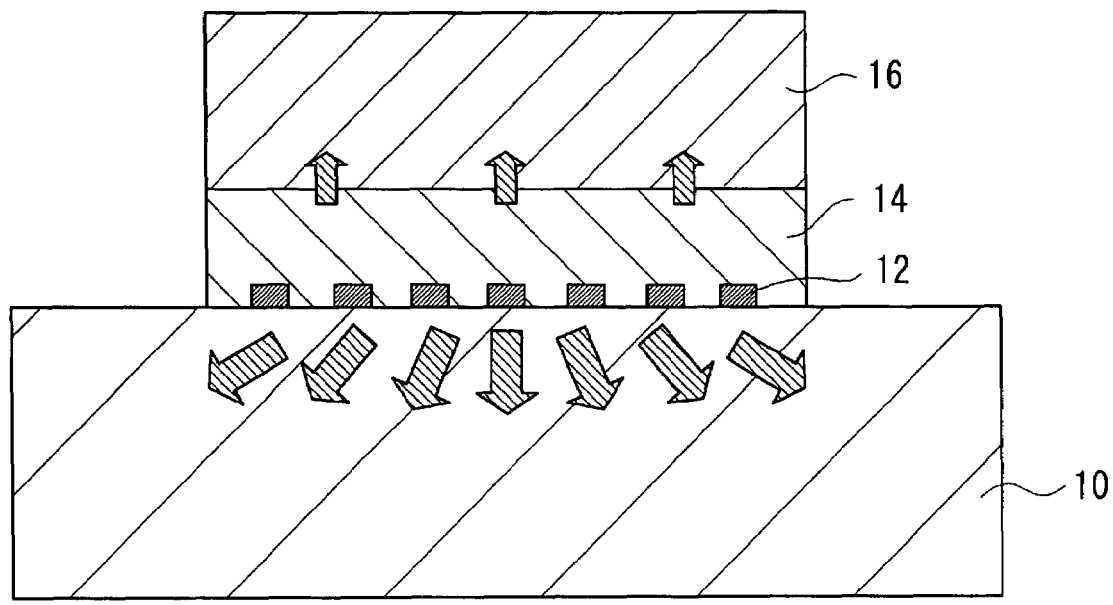
FIG. 2 is a schematic cross-sectional view taken along a line A-A shown in FIG. 1.

As in the case of the third through fifth embodiments, the third medium 16 is not required to directly contact the piezoelectric substrate 10. It is sufficient to arrange the third medium 16 so as to cover at least a part of the side surfaces of the second medium 14 that covers the electrodes 12. In other words, it is enough to arrange the lower surface of the third medium 16 so as to be located at a level lower than the upper surface of the second medium 14. Thus, the third medium 16 can contact the piezoelectric substrate 10 via the barrier layer 30 or the second medium 14a that is thinner than the second medium 14. Thus, it is possible to effectively radiate heat in the third medium 16, as compared to the device shown in FIG. 2.

Sixth Embodiment

Figure 10:
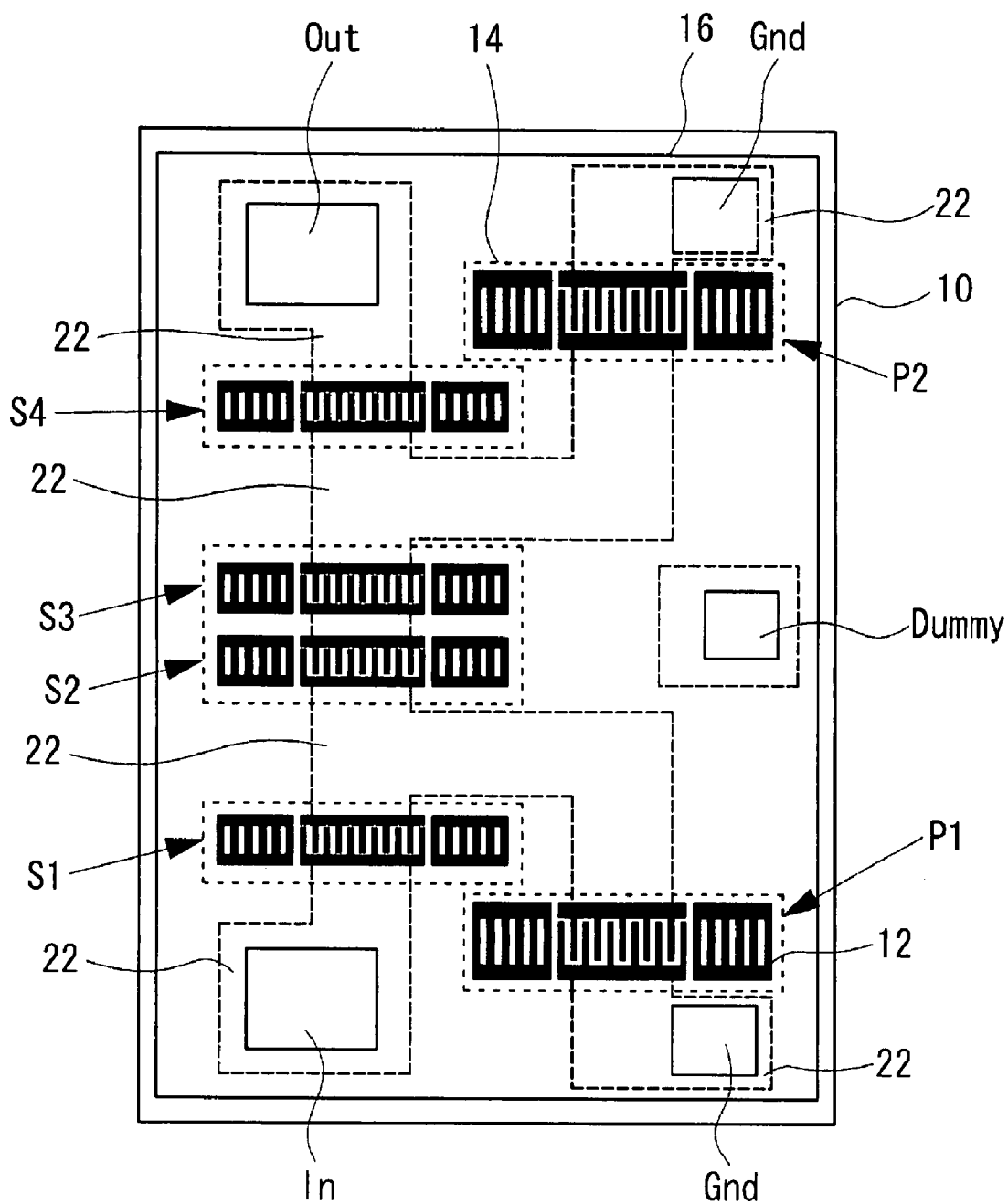
FIG. 10 is a plan view of a filter in accordance with a sixth embodiment.

A sixth embodiment is an exemplary ladder type filter using resonators of the second embodiment. FIG. 10 is a plan view of a filter of the sixth embodiment. Dotted lines form the second media 14 below the third media 16. Thick solid lines are the electrodes 12 including the comb-like electrodes and reflectors in each resonator. Broken lines form the extraction electrodes 22. Series resonators S1 through S4, each of which is the resonator of the second embodiment, are provided in series between an input electrode In and an output electrode Out. Parallel resonators P1 and P2 are provided between nodes on the signal path including the series resonators S1 through S4 and ground. The second media 14 are provided so as to cover the series resonators S1 through S4 and the parallel resonators P1 and P2. In each resonator, the third medium 16 directly contacts the piezoelectric substrate 10 and the extraction electrodes 22 in portions that are not covered with the second medium 14. A block labeled Dummy is a dummy electrode.

According to the sixth embodiment, heat conducting through the third media 16 is applied directly to the piezoelectric substrate 10 and the extraction electrodes 22 as in the case of the second embodiment. Thus, it is possible to improve the heat radiation of each resonator and power durability. The resonators of the first, third or fifth embodiment may be used. It is also possible to apply the resonators of any of the first through fifth embodiments to a multiple mode type acoustic boundary filter.

In the first through sixth embodiments, the substrate 10 (first medium) is required to have piezoelectricity. In order to obtain a large electromechanical coupling coefficient value, $LiTaO_3$ or $LiNbO_3$ is preferably used. The electrodes 12 are required to be made of a material having electric conductivity and are capable of exciting acoustic boundary waves. In order to increase reflection of the acoustic boundary waves, it is preferable to form the electrodes of a material having a high density such as copper or gold. Further, a material having a small resistivity value is preferably selected in terms of reduced loss. A material containing copper is preferably used. The second medium 14 is required to be made of a material different from that of the substrate 10. It is preferable that the second medium is made of a material through which boundary waves are propagated at an acoustic velocity lower than the acoustic velocities of the substrate 10 and the third medium 16 in order to efficiently confine the acoustic waves within the second medium 14. Preferably, the second medium 14 is made of silicon oxide. The third medium 16 is required to have a heat conductivity higher than that of the second medium 14, and is preferably made of silicon, silicon nitride, aluminum nitride or aluminum oxide.

The present invention is not limited to the specifically disclosed embodiments but include other embodiments and variations without departing from the scope of the present invention.

The present invention is based on Japanese Patent Application No. 2006-157568 filed Jun. 6, 2006, the entire disclosure of which is hereby incorporated by reference.

What is claimed is:

1. An acoustic boundary wave device comprising:
a first medium having piezoelectricity;
electrodes that are provided on the first medium and excite acoustic waves;
a second medium made of a material different from the first medium and provided on the first medium so as to cover the electrodes; and
a third medium that has a heat conductivity higher than that of the second medium and is provided so as to contact an upper surface of the second medium and at least a part of side surfaces of the second medium.

2. The acoustic boundary wave device as claimed in claim 1, wherein at least a part of the third medium contacts the first medium.

3. The acoustic boundary wave device as claimed in claim 1, further comprising a barrier layer provided between the electrodes and the second medium, wherein at least a part of the third medium thermally contacts the first medium via the barrier layer.

4. The acoustic boundary wave device as claimed in claim 1, further comprising a radiator provided on the first medium and made of a metal, wherein at least a part of the third medium contacts the radiator.

5. The acoustic boundary wave device as claimed in claim 1, further comprising:
a barrier layer provided between the electrodes and the second medium; and
a radiator provided on the first medium and made of a metal,
wherein at least a part of the third medium contacts the radiator.

6. The acoustic boundary wave device as claimed in claim 4, wherein the radiator is electrically connected to electrodes that are included in the electrodes and excite the acoustic waves.

7. The acoustic boundary wave device as claimed in claim 5, wherein the radiator is electrically connected to electrodes that are included in the electrodes and excite the acoustic waves.

8. The acoustic boundary wave device as claimed in claim 1, wherein the second medium includes silicon oxide.

9. The acoustic boundary wave device as claimed in claim 1, wherein the electrodes include electrodes that excite the acoustic waves and contain copper.

10. The acoustic boundary wave device as claimed in claim 1, wherein the third medium contains any of silicon, silicon nitride, aluminum nitride and aluminum oxide.

11. The acoustic boundary wave device as claimed in claim 1, wherein the acoustic boundary wave device is a resonator.

12. A filter comprising resonators, each of which comprising:
a first medium having piezoelectricity;
electrodes that are provided on the first medium and excite acoustic waves;
a second medium made of a material different from the first medium and provided on the first medium so as to cover the electrodes; and
a third medium that has a heat conductivity higher than that of the second medium and is provided so as to contact an upper surface of the second medium and at least a part of side surfaces of the second medium.

* * * * *